(12) United States Patent
Wetzel

(10) Patent No.: US 8,379,395 B2
(45) Date of Patent: Feb. 19, 2013

(54) ELECTRICAL COMPONENT

(75) Inventor: Gerhard Wetzel, Korntal-Meunchingen (DE)

(73) Assignee: Robert Bosch GmbH, Stuttgart (DE)

( * ) Notice: Subject to any disclaimer, the term of this patent is extended or adjusted under 35 U.S.C. 154(b) by 386 days.

(21) Appl. No.: 12/665,735

(22) PCT Filed: Apr. 22, 2008

(86) PCT No.: PCT/EP2008/054857
§ 371 (c)(1),
(2), (4) Date: May 11, 2010

(87) PCT Pub. No.: WO2008/155154
PCT Pub. Date: Dec. 24, 2008

(65) Prior Publication Data
US 2010/0232120 A1    Sep. 16, 2010

(30) Foreign Application Priority Data
Jun. 21, 2007 (DE) .................. 10 2007 028 512

(51) Int. Cl.
*H05K 1/00* (2006.01)
*H05K 1/18* (2006.01)
*H05K 7/00* (2006.01)
(52) U.S. Cl. ....................................... 361/748
(58) Field of Classification Search ............ None
See application file for complete search history.

(56) References Cited

U.S. PATENT DOCUMENTS

| 5,319,522 A * | 6/1994 | Mehta ........................... 361/748 |
| 5,541,367 A * | 7/1996 | Swamy .......................... 174/260 |
| 6,372,998 B1 * | 4/2002 | Suzuki et al. ................ 174/260 |
| 6,404,048 B2 * | 6/2002 | Akram ............................ 257/706 |
| 6,700,174 B1 * | 3/2004 | Miu et al. ..................... 257/419 |
| 7,120,024 B2 * | 10/2006 | Watanabe et al. ............ 361/704 |
| 7,220,915 B1 | 5/2007 | Park et al. |
| 2003/0019647 A1 | 1/2003 | Luettgen et al. |
| 2005/0213308 A1 | 9/2005 | Suzuki et al. |
| 2007/0255509 A1 * | 11/2007 | LeFebvre et al. .............. 702/33 |
| 2007/0279877 A1 * | 12/2007 | Dobritz et al. ............... 361/760 |
| 2008/0150811 A1 * | 6/2008 | Honda et al. ................. 343/702 |
| 2008/0156511 A1 * | 7/2008 | Hauer et al. ................. 174/50.5 |
| 2008/0266811 A1 * | 10/2008 | Yamada et al. ............... 361/720 |

FOREIGN PATENT DOCUMENTS

| CN | 1160290 | 9/1997 |
| DE | 10013255 A1 | 10/2000 |
| JP | 51-146974 | 5/1950 |
| JP | 63-108761 | 5/1988 |
| JP | 8-130283 | 5/1996 |
| JP | 2003-37241 | 2/2003 |

OTHER PUBLICATIONS

International Search Report for PCT/EP2008/054857.

* cited by examiner

*Primary Examiner* — Lisa Lea Edmonds
*Assistant Examiner* — Xanthia C Cunningham
(74) *Attorney, Agent, or Firm* — Kenyon & Kenyon LLP

(57) ABSTRACT

An electrical component system and method is provided. In an embodiment, the electrical component system includes a circuit carrier onto which at least one electrical component has been mounted. The circuit carrier is injection molded around using a molding compound. An embedding length of a circuit-board conductor in the molding compound, situated between the contacting area on the circuit carrier and the exit location, is maximized.

15 Claims, 3 Drawing Sheets

ELECTRICAL COMPONENT

FIELD OF INVENTION

The present invention relates to an electrical component system and method.

BACKGROUND INFORMATION

Electrical and electronic components may be exposed to aggressive, low-viscosity liquid media at their respective mounting locations. Among these electrical and electronic components, for example, rotational speed sensors in automatic transmissions may be exposed to automatic transmission fluid (ATF) filling the transmissions. Because of the very low viscosity of such fluids, such fluids tend to creep which means that they may affect components such as the rotational speed sensors. Accordingly, tight packaging of these electrical and electronic components is required.

In the case of electrical components used these days, such as the Hall elements, the attempt to achieve the sealing is made by extruding the components using a sealing material. This sealing material may be an epoxy resin or the like, so that no liquids are able to penetrate to the electrical and electronic components, because of encapsulation in the molding compound. The critical region, in this instance, is the location at which the current or voltage carrying circuit-board conductors or lead frames protrude out of the molding compound, for instance, out of the epoxy resin. Current experience has shown that, in spite of the sealing compound, the problem keeps arising that, under extreme load, liquids penetrate into the sealed electrical components anyway and are able to damage the electrical components by corrosion, for instance. The penetration of aggressive, low-viscosity media, such as the transmission oil mentioned before, may be favored, for instance, by fluxing agent residues, which have become attached, during the production of continuous material connections, in the contact area, such as during soldering, and which may consequently also be present in the sealing region. Fluxing agent residues prevent a flawless, tight connection between the sealing material and the respective circuit-board conductor.

One may provide a greater sealing length which acts to improve the seal. In the case of the extended sealing length, an extended creep path is impressed on the aggressive, low-viscosity medium penetrating the circuit-board conductors, until it has advanced up to the electrical contacting location. However, this extended sealing length usually also brings with it a greater design length of the whole electrical component, which, in turn, is not desirable for construction and cost reasons.

SUMMARY

Embodiments of the present invention provide an increased security from the penetration of liquids in electrical or electronic components that are exposed to aggressive, low-viscosity media, without enlarging the size of the respective component.

Embodiments of the present invention provide an extended sealing of a circuit-board conductor or lead frame, that is an integral component of the electrical component. In the case of this circuit-board conductor or this lead frame, which is fitted with electrical or electronic components on one side, and which is contacted electrically on the opposite flat side, a continuous material connecting location which is developed, for example, as a soldering location, lies at the maximum possible distance from the sealing location. In an embodiment, the sealing location, which usually represents the exit location of the corresponding voltage or current carrying circuit-board conductors from the electronic component to the environment, represents the primary area of contamination. In an embodiment, based on the maximally possible distance of the electrical contacting location, the probability of its contamination at the exit location from the molding compound, that is, from the electrical component, is decisively reduced. In an embodiment because of the maximally extended embedding path of the lead frame or of a circuit-board conductor in the sealing or molding compound, an improved seal is achieved. In an embodiment, a maximum possible sealing length, that is, the distance between the electrical contact location, that may be developed, for example, as a soldering location, and the sealing location is achieved without overall size L of the electrical component having to be extended.

Following the design approach according to an embodiment of the present invention, electrical components, which are located on one side of a circuit carrier, are extruded using a sealing or molding compound preferably made of epoxy resin. The extruded electrical and electronic component is embedded in the molding compound, which represents the housing.

In an embodiment of the present invention, the contacting area of the circuit carrier is moved so that a sealing path, i.e., the distance between the contacting location and the exit location from the extrusion material of the circuit-board conductor is maximized. In an embodiment of the present invention, an extension of the sealing path is achieved in that the circuit-board conductor (e.g., lead frame) is provided with one or more meander-shaped loops, in order, in this manner, to elongate the embedding length of the circuit-board conductor within the molding compound. In an embodiment of the present invention, the contacting area is maintained, and a maximization of the embedding length of the circuit-board conductor (e.g., lead frame) in the molding compound is achieved in that the exit region of the circuit-board conductor or the lead frame from the extruding material is placed at a maximum distance from the contacting location.

DETAILED DESCRIPTION

Figure 1:
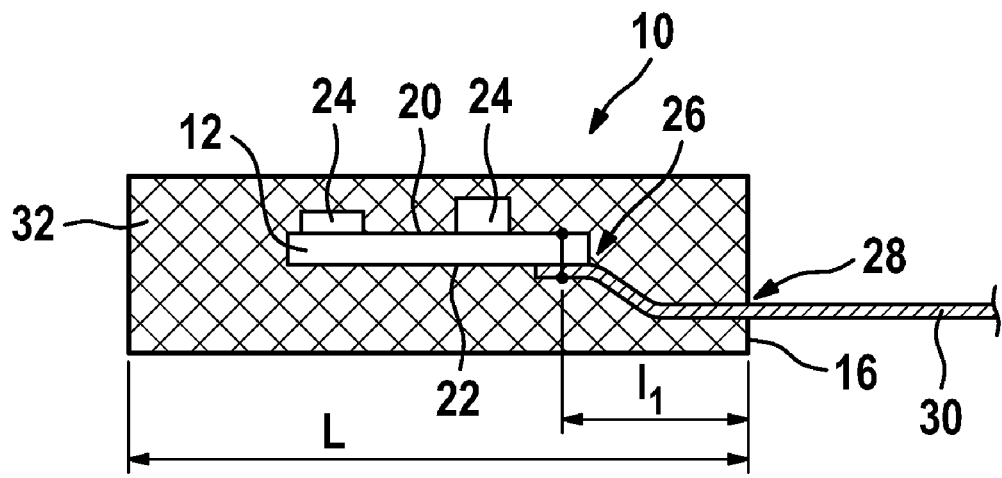
FIG. 1 shows the contacting of a circuit carrier of an electrical component according to the related art.

In FIG. 1, the electrical component 10 includes a circuit carrier 12. The circuit carrier 12 is surrounded by a molding compound 32 which represents the housing of circuit carrier 12. The circuit carrier 12 includes a top side 20 and a bottom side 22. On the top side 20 of the circuit carrier 12, there is at least one electrical or electronic component 24, such as a Hall element in the case where electrical component 10 is a rotational speed sensor.

For the electrical component, there is a contacting area 26 of horizontally embedded circuit carrier 12 at its bottom side 22. At contacting area 26, which may involve, for example, a continuous material connecting point between circuit carrier 12 and a circuit-board conductor 30 or a lead frame 30, a circuit-board conductor 30 is connected electrically to the circuit carrier 12. The length along which circuit-board conductor 30 extends through molding compound 32 of electrical component 10 within housing is indicated by $l_1$, and the length of electrical component 10 is designated as L.

It is seen from the illustration in FIG. 1 that the sealing path runs only along sealing path length $l_1$ through molding compound 32. If fluxing agent residues are adhering to the top side or the surfaces of the circuit-board conductor or the lead frame, which have settled on them during the production process of contacting area 26, this prevents a flawlessly tight connection between molding compound 32 and circuit-board conductor 30, since these favor the creeping of transmission oil, for example. When electrical component 10 is used in an environment having an aggressive and low-viscosity medium, such as automatic transmission fluid (ATF), this low-viscosity liquid medium creeps along the surface of the circuit-board conductor or lead frame 30 into the inside of molding compound 32 to contacting area 26.

Figure 2:
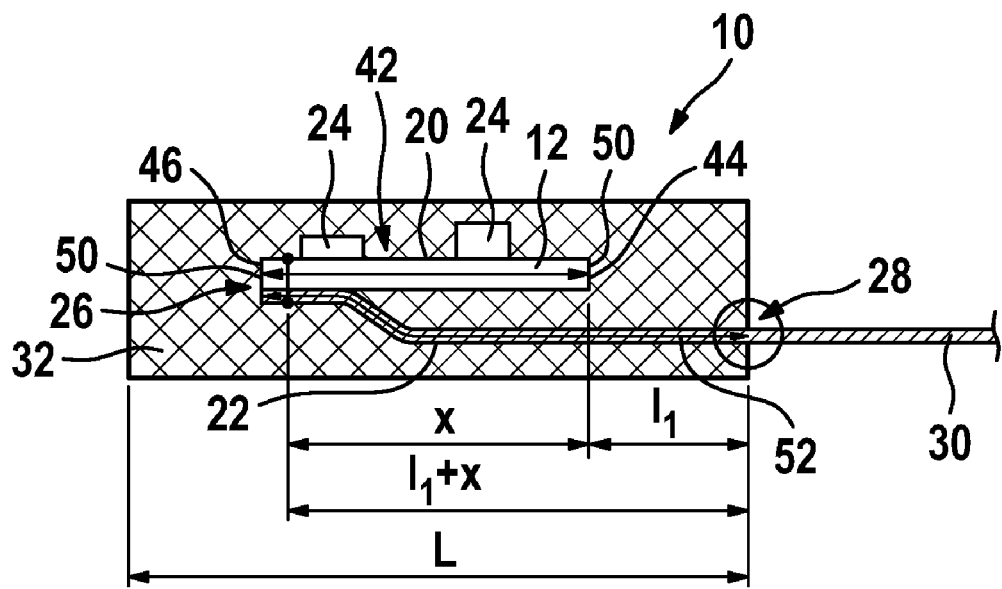
FIG. 2 shows the contacting of a molded-in circuit carrier according to an embodiment of the present invention.

FIG. 2 shows an embodiment of the present invention for sealing an electrical contacting of a circuit carrier in an electrical component.

In FIG. 2, electrical component 10, developed in a length L, which may be, for instance, a rotational speed sensor that is built into a vehicle transmission, and which is exposed to being wetted by transmission oil, an embedding length 52 of the circuit-board conductor 30 in addition to sealing path length $l_1$ is elongated by an extended sealing path x. As shown in FIG. 2, embedding length 52 of circuit-board conductor 30 extends in molding compound 32, which is, e.g., an epoxy sealing compound, from its contacting area 26 to exit location 28 of circuit-board conductor 30 from molding compound 32. Circuit-board conductor 30 and the lead frame represent current conducting or voltage conducting components. In an embodiment, because of the circuit-board conductor 30 or the lead frame, which is in contact with circuit carrier 12 at the at least one contacting area 26, circuit carrier 12 is held in the tooling while the extrusion using sealing compound or molding compound 32 is taking place.

In FIG. 2, on the top side 20 of the circuit carrier 12, there is at least one electrical or electronic component 24, such as a Hall sensor. In an embodiment, on the top side 20 of circuit carrier 12 at least one electrical component 24 is situated, and contacting area 26 lies at bottom side 22 of the circuit carrier 12 that is molded in, in an essentially horizontal molding position 42 inside molding compound 32, which represents the housing.

In an embodiment, molding position 42, in which circuit carrier 12 is embedded in molding compound 32, has an essentially horizontal orientation. In FIG. 2, the circuit-board conductor 30 (e.g., lead frame) runs along a longitudinal extension 48 of the circuit carrier 12.

In FIG. 2, in contrast to the illustration of FIG. 1, contacting area 26 has been moved from a first contacting end 44 of circuit carrier 12 to its second contacting end 46. Because of the moving of contacting area 26 on bottom side 22 of circuit carrier 12, an extension of sealing path length $l_1$ by path x is created, so that embedding length 52, that is, the path length of circuit-board conductor 30 from contacting area 26 to exit location 28 from housing 14 has been at least doubled, compared to the illustration according to FIG. 1. Contacting area 26 is formed essentially by an opening in circuit carrier 12 that is filled with solder, one free end of circuit-board conductor 30, or the lead frame, to be contacted extending into the opening.

In an embodiment, based on maximized embedding length 52, the sealing effect between circuit-board conductor 30 or lead frame 30 and molding compound 32 encasing them is increased considerably. In an embodiment, the seal proposed according to the present invention, shown, for example, in FIG. 2, realizes a maximally possible distance between exit location 28, of the circuit-board conductor 30, from molding compound 32 and the end of the circuit-board conductor 30 which is fastened in contacting area 26, on the bottom side 22 of the circuit carrier 12, in a manner using continuous material, in an electrically conductive fashion by way of soldering. In the embodiment of FIG. 2, exit location 28 is at the same location of molding compound 32.

Figure 3:
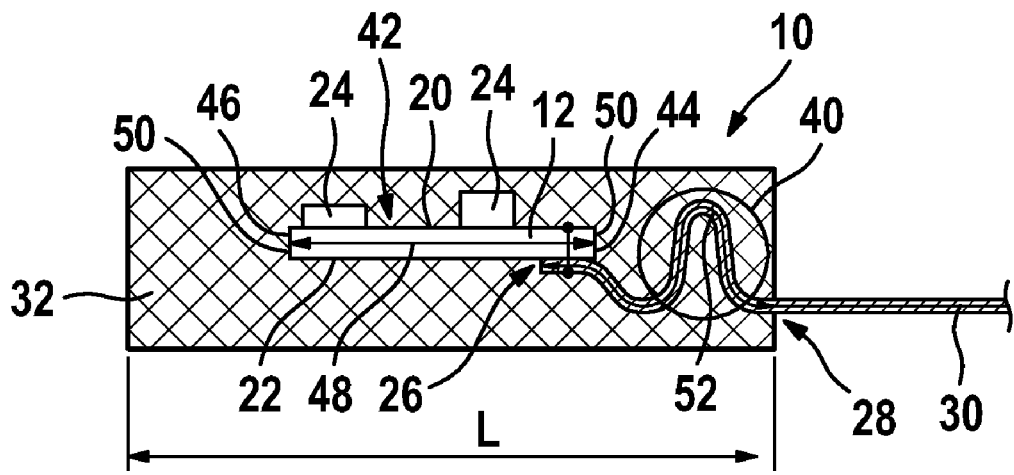
FIG. 3 shows the contacting of a circuit carrier accommodated in a molding compound according to an embodiment of the present invention.

In FIG. 3, an embodiment of the present invention of the sealing of an electrical component is shown.

In FIG. 3, according to this embodiment of the present invention, embedding length 52 of circuit-board conductor 30 molding compound 32, developed, e.g., as an epoxy sealing compound, is extended by at least one meander 40. The extension of embedding length 52, achieved by the specific embodiment according to FIG. 3, essentially corresponds to extension x of the sealing path achieved, e.g., in the specific embodiment according to FIG. 2, by moving contacting area 26. In FIG. 3, contacting area 26 is located at the same position with respect to circuit carrier 12, namely, at first contacting end 44. In FIG. 3, the exit location 28 of the circuit-board conductor 30 or lead frame 30, from the molding compound 32 of electrical component 10 is also identical. In an embodiment, the improvement of the seal between circuit-board conductor 30, that may be contaminated by fluxing agent residues, with respect to the molding compound 32 is achieved by the at least one meander 40, developed in circuit-board conductor 30 or in lead frame 30. In an embodiment, the extension of embedding length 52 by measures proposed according to the present invention, as shown in FIGS. 2 and 3, do not, however, lead to an increase in length L of housing 14 of electrical component 10, according to the illustrations in FIGS. 2 and 3. It may be seen from the embodiment shown in FIG. 3 that circuit carrier 12 is embedded in molding compound 32 in an essentially horizontally oriented molded position. At the top side 20 of circuit carrier 12, there is at least one electrical or electronic component 24, while contacting area 26 is at bottom side 22 of circuit carrier 12. The circuit carrier 12 extends in a longitudinal extension 48 inside molding compound 32. Edges 50 of the circuit carrier 12 represent a first contacting end 44 and a second contacting end 46 of the circuit carrier 12. Contacting area 26 may also be developed on top side 20, and according to this embodiment, exit location 28 of circuit-board conductor 30 or of lead frame 30 shifts vertically upwards at housing wall 16.

Figure 4:
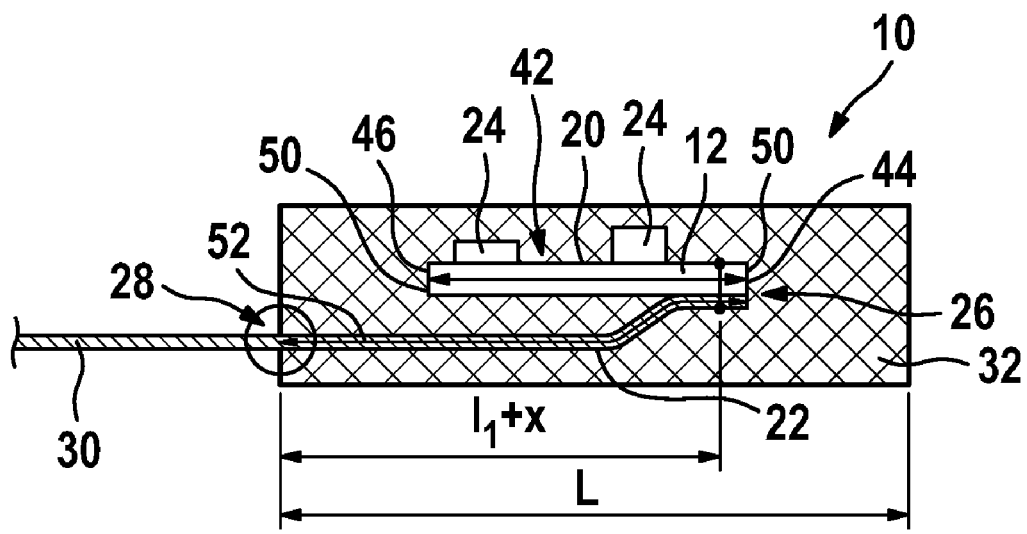
FIG. 4 shows the sealing of a contacting area of a circuit carrier according to an embodiment of the present invention.

In FIG. 4, an embodiment according to the present invention is shown concerning the sealing of the electrical contacting area of a circuit carrier.

In FIG. 4, the circuit carrier 12 is embedded in molding compound 32 in a molding position 42 that is characterized essentially by a horizontal orientation. At the top side 20 of the circuit carrier 12, there is at least one electrical or electronic component 24, which is contacted electrically via contacting area 26 of a circuit-board conductor 30 or a lead frame 30. In the embodiment of FIG. 4, the circuit carrier 12 has a first contacting end 44 and a second contacting end 46, respectively. In contrast to FIG. 1, in which contacting area 26 points towards exit location 28 of circuit-board conductor 30 or lead frame 30 from housing 14, in the embodiment shown in FIG. 4, the exit location 28 is on the opposite side. In the embodiment according to FIG. 4, contacting area 26 is at a first contacting end 44 of the circuit carrier 12 and extends parallel to the longitudinal extension 48 of the circuit carrier 12 to exit location 28 on the side of molding compound 32.

In comparison to the embodiment shown in FIG. 2, the equipping of the top side 20 of the circuit carrier 12 with electrical and electronic components 24 is identical. In the embodiment shown in FIG. 2, contacting area 26 of circuit-board conductor 30 or lead frame 30 is at second contacting end 46. In an embodiment, this brings about an extended embedding length 52 of circuit-board conductor 30 or lead frame 30 that includes sealing path length $l_1$ and its elongation x. In the embodiment of FIG. 4, embedding length 52 is elongated by extension x of sealing path length $l_1$, in this case, however, circuit-board conductor 30 or lead frame 30 being electrically connected at first contacting end 44, at the bottom side 22 of circuit carrier 12. According to the layout of the seal shown in FIG. 4, the exit location 28 is moved to housing wall 16 facing away from first contacting end 44, and the orientation of the circuit carrier 12 is maintained.

According to an embodiment of the present invention, the maximization of the distance between contacting area 26 of circuit-board conductor 30 or lead frame 30, and its or their exit location 28, from molding compound 32 is achieved by an extension x, that takes into account the installation conditions, or by providing at least one meander 40 in circuit-board conductor 30 or lead frame 30. In an embodiment, depending on the installation conditions, the exit location 28 of the circuit-board conductor 30 or lead frame 30 from molding compound 32 is maintained, as shown in the embodiments shown in FIGS. 2 and 3, or, as shown in FIG. 4, is moved to the other side of molding compound 32. As may be seen from the embodiments shown in FIGS. 2, 3 and 4, contacting area 26 between the circuit carrier 12 and the circuit-board conductor 30 or lead frame 30 is placed in such a way that embedding length 52 of the circuit-board conductor 30 or lead frame 30, that is setting in between the contacting area 26 and the exit location 28, is maximized. In the case of the same equipment of the top side 20 of the circuit carrier 12 with at least one electrical or electronic component 24, the contacting area 26 may lie at its bottom side 22, either at a first contacting end 44 or at a second contacting end 46. The position of the contacting area 26 is selected, in each case, in such a way that the path length over which the circuit-board conductor 30 or lead frame 30 extends through molding compound 32 is maximized, be it by an extension x, or be it by at least one meander 40, for example, that is developed in lead frame 30 or in circuit-board conductor 30.

In an embodiment, starting from the position of exit location 28 of circuit-board conductor 30 or lead frame 30 in molding compound 32, and, the embedding length 52 of circuit-board conductor 30 or frame 30 in molding compound 32 is selected so that the distance between contacting area 26 and exit location 28 is maximized. In an embodiment, the creeping of low-viscosity liquid media, such as automatic transmission fluid (ATF), along the top and bottom sides of circuit-board conductor 30 or lead frame 30 to electrical contacting area 26 is impeded and, even if it is not completely eliminated, it is made considerably more difficult, as viewed over the service life. In embodiments of the present invention, the circuit-board conductor 30 or lead frame 30 is cleaned of fluxing agent residues, which favor the creep of transmission oil, for example, along circuit-board conductor 30 or lead frame 30.

Figure 5:
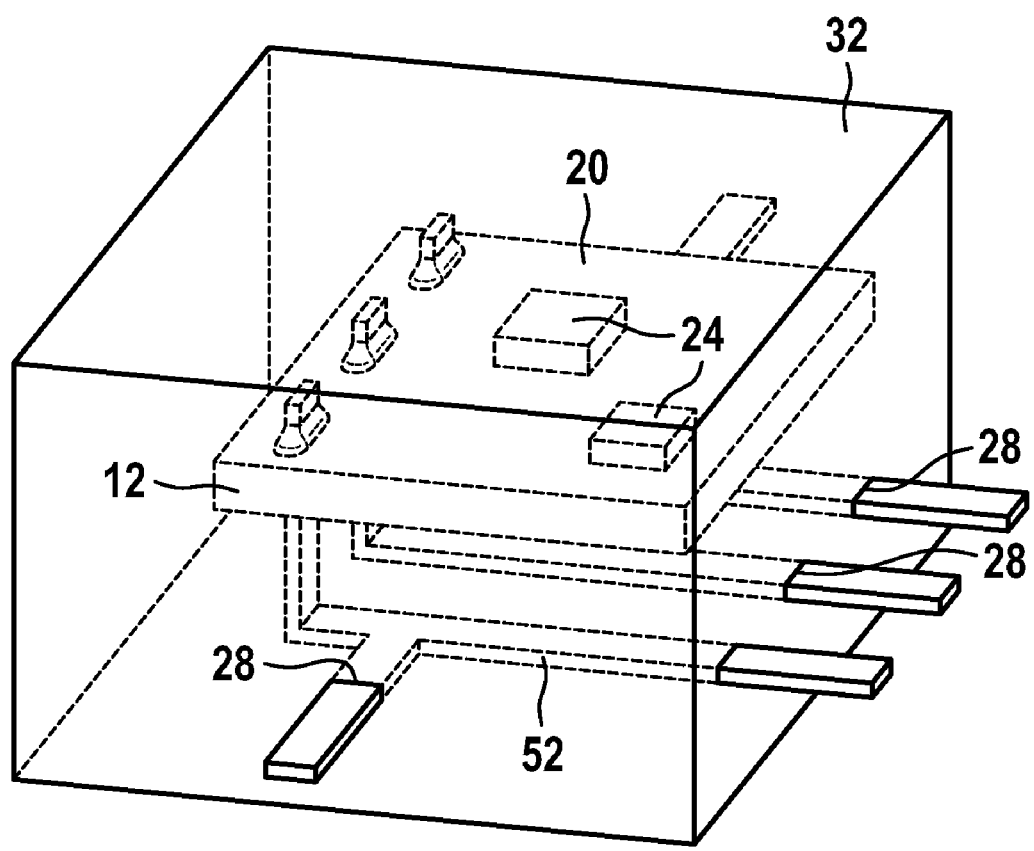
FIG. 5 shows a perspective representation of a circuit carrier embedded in molding compound according to an embodiment.

In FIG. 5, a perspective representation of a circuit carrier embedded in molding compound is shown.

For example, an injection-molded part may be seen in the perspective rendering of FIG. 5. The circuit carrier 12 is inserted into the cavity of a tool, e.g., an injection molding die, supported at the ends of circuit-board conductor 30 or lead frame 30 which jut out from the side surfaces of molding compound 32 in FIG. 5. In an embodiment, circuit-board conductors 30 or lead frame 30, that leave the molding compound body at exit locations 28, as shown in FIG. 5, are electrically contacted to the respective circuit carrier 12 at contacting areas 26. In addition to the function of supplying circuit carrier 12 and electrical or electronic components 24, that are accommodated on it, with current or voltage, circuit-board conductor 30 or lead frame 30 has the task of holding the circuit carrier by fixing it in position at contacting areas 26 in the cavity of the injection molding die. After the cavity is closed, the circuit carrier 12 is injection molded around with sealing or molding compound 32, so that the circuit carrier 12, along with electronic components 24 accommodated on it, on its top side 20 and/or on its bottom side 22, is injection molded around. Accordingly, in embodiments, circuit-board conductors 30 that are contacted at contacting areas 26 to circuit carrier 12, besides taking on the task of supplying current or voltage, also take on the function of holding circuit carrier 12 in the cavity of the injection molding die. Contacting areas 26 are, e.g., developed as soldering connections in openings in the material of circuit carrier 12, into which the free ends of circuit-board conductor 30 or lead frame 30 extend, before the openings enclosing the free ends of circuit-board conductor or lead frame 30 are filled up with solder.

What is claimed is:

1. An electrical component system, comprising:
    a circuit carrier, the circuit carrier being injection molded around using a molding compound,
    at least one of an electrical component and an electronic component mounted on the circuit carrier; and
    a circuit-board conductor running along a length of the circuit carrier starting from a contacting area of the circuit carrier to an edge of the circuit carrier and then extending to an exit location of the molding compound, wherein the running along length is at least equal to the extension from the edge of the circuit carrier to the exit location.

2. The electrical component system of claim 1, wherein the circuit carrier has a first contacting end and a second contacting end.

3. The electrical component system of claim 2, wherein the contacting area of the circuit carrier lies at that one of its contacting ends which is at a maximum distance from the exit location of the at least one circuit-board conductor.

4. The electrical component system of claim 3, wherein the maximum distance is the running along length plus the extension.

5. The electrical component system of claim 1, wherein the circuit-board conductor includes at least one meander.

6. The electrical component system of claim 1, wherein the molding compound is an epoxy sealing compound.

7. The electrical component system of claim 1, wherein the contacting area of the circuit carrier lies at the contacting end facing away from the exit location of the at least one circuit-board conductor.

8. The electrical component system of claim 1, wherein the contacting area of the circuit carrier lies on the side of the circuit carrier facing away from the at least one electrical or electronic component.

9. The electrical component system of claim 1, wherein the circuit carrier is embedded in the molding compound in an essentially horizontal molding position.

10. The electrical component system of claim 1, wherein it is accommodated as a rotational speed sensor in a vehicle transmission, and is exposed to a low-viscosity liquid.

11. The electrical component system of claim 10, wherein the low-viscosity liquid is transmission oil.

12. The electrical component system of claim 1, wherein the contacting area of the circuit carrier is located at an end of the circuit carrier furthest away from the exit location.

13. The electrical component system of claim 1, wherein the contacting area of the circuit carrier is selected such that a total length of the circuit board conductor is at least twice a shortest distance from an edge of the circuit carrier to the exit location.

14. A method for preparing an electrical component system, comprising:
   providing at least one of an electrical component and an electronic component;
   injection molding a circuit carrier, the circuit carrier being injection molded around using a molding compound;
   mounting the at least one of the electrical component and the electronic component on the circuit carrier; and
   situating a circuit-board conductor to run along a length of the circuit carrier starting from a contacting area of the circuit carrier to an edge of the circuit carrier and then extending to an exit location of the molding compound, wherein the running along length is at least equal to the extension from the edge of the circuit carrier to the exit location.

15. An electrical component system, comprising:
   a circuit carrier, the circuit carrier being injection molded around using a molding compound,
   at least one of an electrical component and an electronic component mounted on the circuit carrier; and
   a circuit board conductor extending from a contacting area of the circuit carrier to an exit location of the molding component, wherein the circuit board conductor includes at least one meander such that a total length of the circuit board conductor is at least twice a shortest distance from the contacting area to the exit location.

* * * * *

UNITED STATES PATENT AND TRADEMARK OFFICE
CERTIFICATE OF CORRECTION

PATENT NO. : 8,379,395 B2 Page 1 of 1
APPLICATION NO. : 12/665735
DATED : February 19, 2013
INVENTOR(S) : Gerhard Wetzel It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 526 days.

Signed and Sealed this
First Day of September, 2015

Michelle K. Lee
*Director of the United States Patent and Trademark Office*